United States Patent [19]

Allner

[11] B 3,914,700

[45] Oct. 21, 1975

[54] SWITCHING ARRANGEMENT FOR PICKING UP STORED CONSTANT VOLTAGES

[75] Inventor: Olaf Allner, Berlin, Germany

[73] Assignee: Loewe-Optal GmbH, Kronach, Germany

[22] Filed: Apr. 17, 1973

[21] Appl. No.: 351,863

[44] Published under the Trial Voluntary Protest Program on January 28, 1975 as document no. B 351,863.

[30] Foreign Application Priority Data

May 4, 1972 Germany .............................. 2221773

[52] U.S. Cl. ................ 328/141; 330/30 D; 334/15; 307/235; 307/320

[51] Int. Cl.²...... H03B 3/04; H03J 3/04; H03J 5/02

[58] Field of Search............ 307/320, 295, 241–243; 328/138, 140, 141, 155; 330/30 D; 334/11, 15; 325/422

[56] References Cited

UNITED STATES PATENTS

| | | | |
|---|---|---|---|
| 3,528,043 | 9/1970 | Richter et al. | 334/15 X |
| 3,588,752 | 6/1971 | Hirshfield | 334/15 X |
| 3,593,044 | 7/1971 | McNeilly | 307/320 X |
| 3,617,855 | 11/1971 | Hisatsu | 330/30 D |
| 3,617,916 | 11/1971 | Smith | 307/242 X |
| 3,684,977 | 8/1972 | Viles | 334/15 X |
| 3,699,455 | 10/1972 | Kruszewski et al. | 334/15 X |
| 3,750,028 | 7/1973 | Uchida | 334/15 X |

FOREIGN PATENTS OR APPLICATIONS

| | | | |
|---|---|---|---|
| 782,740 | 9/1957 | United Kingdom | 328/155 |
| 1,065,907 | 4/1967 | United Kingdom | 334/11 |

*Primary Examiner*—Rudolph V. Rolinec
*Assistant Examiner*—L. N. Anagnos

[57] ABSTRACT

A circuit arrangement for recalling stored, constant electric voltages such as tuning voltages for fixed transmitter selection in communication devices with capacitance diode-tuning in which the tuning voltages for the capacitance diodes are adapted to be picked off by means of an adjustable voltage storer, the arrangement including a common differential amplifier stage connected with the circuit to be tuned or adjusted, the common differential amplifier circuit being oppositely selectively coupled through at least one further, adjustable, uni- or multi-stage differential amplifier with each of voltage storers. The further uni- or multi-stage differential amplifier preferably has a symmetrical output which is connected with the inputs of the common differential amplifier.

5 Claims, 2 Drawing Figures

SWITCHING ARRANGEMENT FOR PICKING UP STORED CONSTANT VOLTAGES

Figure 1:
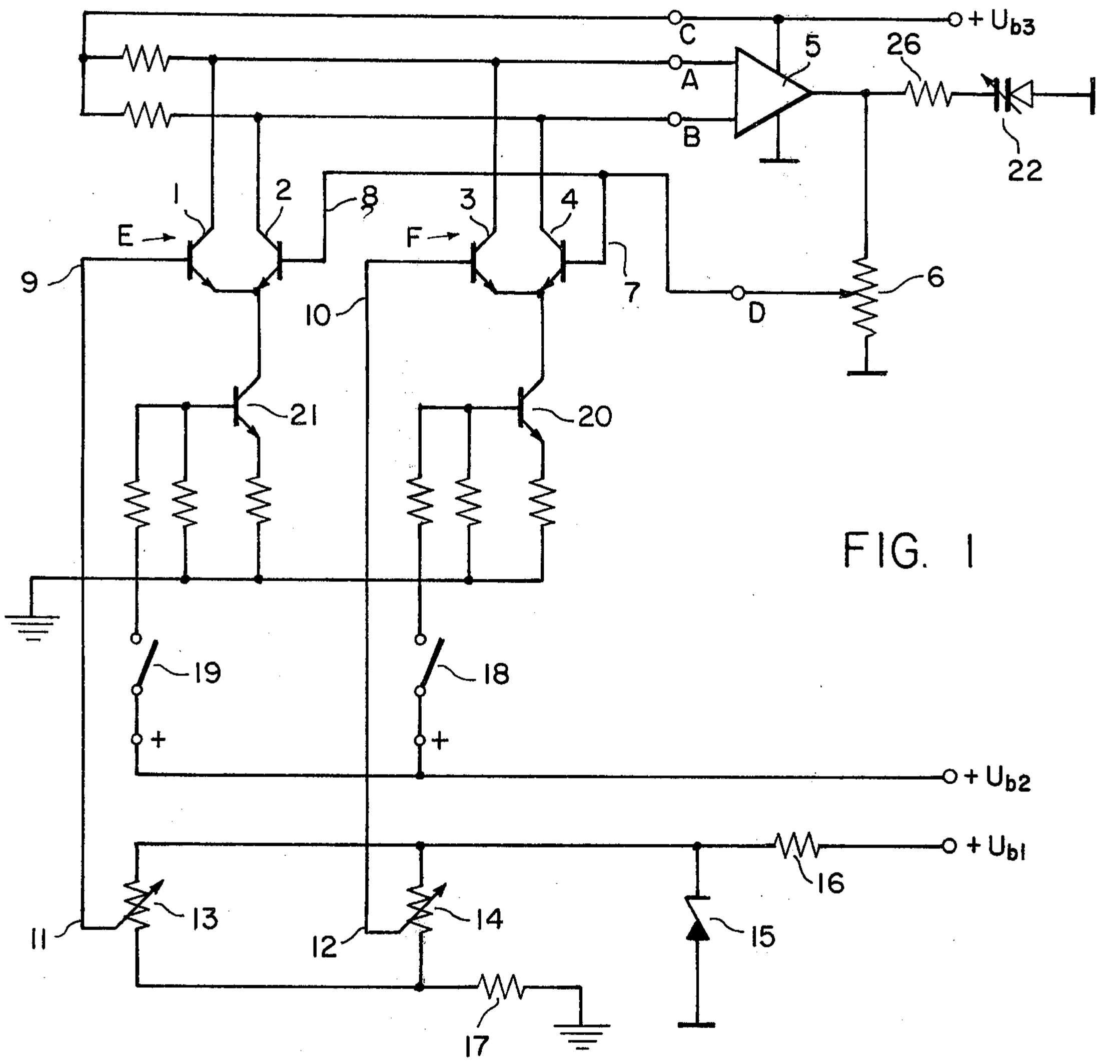

This invention relates to a switching arrangement for picking up stored constant voltages, for example, tuning voltages for fixed transmitting selection in communicating devices such as radio and TV receivers, having capacitance diode tuning, in which the tuning voltages for the capacitance diodes can be read off from an adjustable voltage storer, preferably a potentiometer storer.

It is known to read off the tuning voltages which are stored in the potentiometer circuits for fixed transmitter selection by manually actuable switches. In such known devices the voltages are picked off from the individual potentiometers for changing the tuners or oscillators of the tuning circuit, and the means for activating the pertinent switch is placed at the capacitance diodes of the corresponding tuning circuits or oscillators.

It is furthermore known to switch the tuning voltages electronically by means of so-called sensor scanners which are contactless switching members actuated by energizing fields. In a known embodiment the individual contacting fields act directly with an integrating circuit (IC), the outputs of which are connected with the individual potentiometers of the voltage storer. With the contacting of an individual sensor key a corresponding switching order is given to the integrated circuit, whereby the corresponding potentiometer is subjected to the desired voltage. The picked off voltage is conducted in the usual manner to the capacitance diode for tuning the HF-circuit.

A substantial drawback with this type of switching arrangement is that the temperature coefficient enters as a disturbing factor into the manually actuable switch as well as into the electronic switch, so that for the optimal tuning a post-adjusting must be carried out after the switching operation. The temperature coefficient fluctuates in known switching arrangements between 100 to 300 mV/°C. This variation in voltage causes an additional frequency drift during tuning. Also, in switching arrangements wherein the release of the tuning voltage is not effected via a sensor circuit, there is present a frequency drift as a result of the temperature-dependent electrical reference elements.

In order to avoid these drawbacks, it has already been proposed to incorporate in the device temperature compensating circuits, which compensate the voltage changes which result as a consequence of warming up the device, and thereby to make possible an optimum tuning. These types of temperature compensating circuits make the control circuits substantially more costly, and only are limited in providing an optimum tuning.

It is among the objects of this invention to devise an electronic switch which switches through the stored DC voltage which is present at the voltage storer of a tuning circuit or oscillator, for example, a potentiometer storer, in a true and undistorted fashion and without changes caused by changes in temperature coefficients in the circuit, for example, at the capacitance diode of the tuner circuit or oscillator.

This object is attained in accordance with an embodiment of the invention by a combination of a differential amplifier stage which is connected with the controlled circuit to be adjusted, and with at least one oppositely connected, adjustable single or multi-stage differential amplifier which is connected to a voltage storer.

In a further embodiment of the invention that the single or multi-stage differential amplifier is connected by means of a symmetrical output with the inputs of the differential amplifier stage. The first input of the differential amplifier is preferably connected to the voltage storer and the second input is connected as an inverted input with an output of the differential amplifier stage which is connected with the circuit to be controlled. The opposite coupling of the invention causes the same voltage to be present at the inverted input of the differential amplifier as that which is present at the corresponding potentiometer pick off. In accordance with a further feature of the invention, this voltage value is amplified via a post-connected voltage divider, and such amplified voltage is conducted to the capacitance diode for tuning.

In a preferred embodiment of the circuit of this invention, there is provided an electronic switch for the electrical connection of the individual voltage storers to the corresponding differential amplifiers. In one embodiment of the invention the differential amplifier is controlled via a current generator which can be switched by means of an electronic sensor circuit via contacting fields or a manually actuable switch.

As the current generator is switched on the differential amplifier is simultaneously put into operation, whereby the current generator, by means of an emitter opposing coupling and its defined maintained base voltage, limits the differential amplifier current. The DC key input voltage range is very high with this differential amplifier due to the current generator. By this it is to be understood that the voltage at both inputs of the differential amplifier can be continuously increased in the same sense through a large range without the working points of both transistors being thereby displaced.

In a further embodiment of the invention there are provided a plurality of further similar differential amplifiers connected in parallel, there is arranged for each such further differential amplifier a separate voltage storer, the symmetrical outputs of the further differential amplifiers being connected with the inputs of a common differential amplifier stage, whereby the further differential amplifiers are individually switchable via a switching member. The further differential amplifiers preferably consist of equal-paired transistors, so that a uniform basic construction and equal electrical properties are available. It is thus possible to arrange the common differential amplifier stage with the oppositely coupled further differential amplifiers in an integrated circuit.

According to a further feature of the invention, the output of the common differential amplifier stage is connected with an amplifier, the output of which is connected with the input of the post-connected "user" circuit, that is, the circuit to be controlled, and with the input of the oppositely coupled inputs of the further differential amplifiers which are connected in parallel relative to each other.

The invention is hereinafter described in conjunction with one embodiment which is illustrated in the drawings and which is explained hereinafter.

Figure 2:
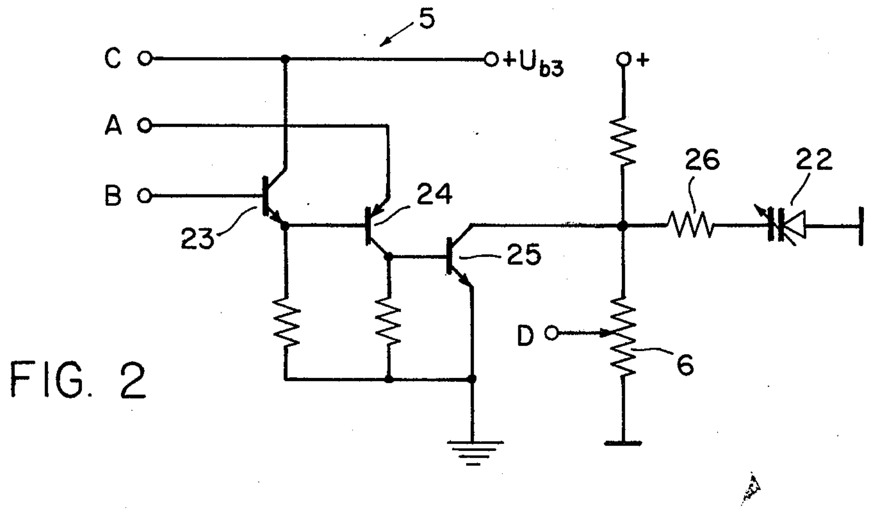

In the drawings:

FIG. 1 is a circuit arrangement in accordance with the invention, said arrangement having a common differential amplifier and two further differential amplifiers consisting of two equal-paired transistors and two potentiometer-voltage storers; and FIG. 2 illustrates the common amplifier stage which is symbolically illustrated in FIG. 1, such common amplifier stage being provided with both differential amplifiers and an integrated output amplifier.

The circuit arrangement illustrated in FIG. 1 consists of two differential amplifiers E and F having equal-paired transistors 1 and 2 (amplifier E), and 3 and 4 (amplifier F), each of which has a symmetrical output which is connected via terminals A and B with the inputs of a common differential amplifier stage 5. The output of this common differential amplifier stage 5 is superimposed via a variable resistance 6, which functions as a voltage divider, and the inverting inputs 7 and 8 of the transistors 4 and 2, respectively, of the further differential amplifiers F and E. There is thus provided a counter coupling. The inputs 9 and 10 of the transistors 1 and 3, respectively, of the differential amplifiers E and F are connected at all times with the pick-offs 11 and 12 of the corresponding potentiometers 13 and 14 of the voltage storer. This voltage storer consists of adjustable potentiometers 13 and 14 which are coupled to a constant voltage source $U_{b1}$. For stabilizing the operating voltage $U_{b1}$, there is connected in the voltage storer a zener diode 15 and a series resistance 16. As a terminal resistance there is furthermore provided a resistance 17 which is grounded. The further differential amplifiers are operable separately from each other by selectively actuating the switches 18, 19. If one or both switches 18 or 19 is actuated, then there is provided a positive operating voltage from the voltage source $U_{b2}$ for the respective current generator formed by transistors 20 and 21. Thereby the corresponding transistor 20 or 21 becomes conductive and adjusts the respective further differential amplifier E, F.

In this embodiment, there is placed at the inverting input 7, 8 of the respective adjusted further differential amplifier the same voltage which is present at the corresponding potentiometer pick off 11, 12. This voltage is amplified via the post-connected voltage divider 6 the amplified voltage being impressed upon the capacitance diode 22, and thereby effects the desired retuning of a non-illustrated swing circuit.

The current generators with the transistors 20, 21 causes, by means of its emitter counter-coupling and its defined maintained base voltage, a limit of the differential amplifier current. Advantageously, the equal-key-input voltage range of the adjusted differential amplifier is very accurately maintained by means of the current generators 20, 21. It should be understood that at both inputs 7 and 9, respectively, 8 and 10 of the further adjusted differential amplifier the impressed voltages can be continuously and substantially increased in the same sense in a very large range without displacing thereby the working points of the equal-paired transistors 1 and 2, respectively, 3 and 4. The common differential amplifier stage 5 and the symmetrical outputs of both further differential amplifiers are connected via a connecting terminal C to a constant operating voltage source $U_{b3}$.

The manner of operation of the common differential amplifier stage 5 will now be explained in connection with FIG. 2, wherein there is disclosed a detailed circuit of such stage. For the function of the entire circuit arrangement, it is indispensable that the symmetrical output of the further differential amplifiers E and F which are connected with a voltage storer be coupled via the terminals A and B with the common differential amplifier stage 5. One of the output branches in the embodiment shown is connected via the terminal B with an NPN-transistor 23 which is connected as an emitter follower. This NPN-transistor measures the differential voltage being impressed upon one output. This voltage is compared in a post-connected PNP-transistor 24 with the voltage impressed upon the second output branch near the terminal A. The emitter of the PNP-transistor 24, for this purpose, is connected to the terminal A. The thus obtained output voltage at the collector of the PNP-transistor 24 is amplified by means of a post-connected NPN-transistor 25 the collector of which is connected to the resistance 26 at the capacitance diode 22, and is also connected to the voltage divider 6. The pick off of the voltage divider 6 is connected via the terminal D with the inverting inputs of the transistors 2 and 4 (FIG. 1). If there is impressed upon the emitter of the PNP-transistor 24 the same potential as at the base of the transistor 23, then the PNP-transistor 24 is situated in a "floating condition," so that no post-adjustment occurs. Only when a voltage change at the adjusted differential amplifier circuit occurs is there effected an output voltage at the collector of the PNP-transistor 24, which is conducted via the transistor 25 in an amplified condition to the base of the transistors 2 or 4. Thereby oscillation of the circuit arrangement is avoided.

By means of the circuit arrangement in accordance with the invention the tuning voltage which is picked off the potentiometer voltage storer is switched through in a true condition by avoiding all types of temperature-caused fluctuations in the "user" circuit. It is possible, in a further, non-illustrated embodiment, to employ a plurality of differential amplifiers connected in parallel, so that different tuning voltages or user voltages can be switched on. The circuit arrangement is also universally usable, and therefore need not be used only in connection with tuning units.

Although the invention is illustrated and described with reference to a plurality of preferred embodiments, it is to be understood that it is in no way limited to the disclosure of such a plurality of embodiments, but is capable of numerous modifications within the scope of the appended claims.

What is claimed is:

1. In a circuit arrangement for recalling stored constant DC voltages for tuning a circuit via a capacitance-diode wherein the tuning voltages for the capacitance diode are adapted to be picked off by means of a plurality of an adjustable voltage storers, the improvement which comprises, in combination, a common differential amplifier whose output is coupled to the capacitance diode a plurality of adjustable further differential amplifiers each associated with a voltage storer and operable when conditioned for exciting the common differential amplifier, each further differential amplifier having first and second inputs and at least one output connected to the common differential amplifier, first means for connecting the first input of each further differential amplifier to the output of the associated voltage storer, second means for connecting the output of the common differential amplifier to the second input of each further differential amplifier, and means for independently conditioning each of the respective further differential amplifiers for operation.

2. A circuit arrangement according to claim 1, in which the conditioning means comprises, in combination, a plurality of current generators individually connected in the current paths of the further differential amplifiers, and switching means for individually exciting each of the current generators.

3. A circuit arrangement according to claim 1, wherein each further differential amplifier has a pair of oppositely incrementable outputs, such outputs being connected with the respective inputs of the common differential amplifier.

4. A circuit arrangement according to claim 1, in which the second connecting means includes an adjustable voltage divider.

5. A circuit arrangement according to claim 1, wherein each further differential amplifier comprises equal-paired transistors.

* * * * *